United States Patent [19]

Graham

[11] Patent Number: 4,786,876

[45] Date of Patent: * Nov. 22, 1988

[54] CONTINUITY TEST METHOD AND TEST CARD CIRCUIT

[75] Inventor: Randall C. Graham, Nashville, Tenn.

[73] Assignee: Essex Group, Inc., Fort Wayne, Ind.

[*] Notice: The portion of the term of this patent subsequent to Apr. 26, 2005 has been disclaimed.

[21] Appl. No.: 868,968

[22] Filed: May 30, 1986

[51] Int. Cl.[4] .......................................... G01R 31/12
[52] U.S. Cl. .................................... 324/551; 324/544; 340/647
[58] Field of Search ................... 324/51, 54, 509, 551, 324/541, 544, 557, 558, 559; 340/647

[56] References Cited

U.S. PATENT DOCUMENTS

| | | | |
|---|---|---|---|
| 1,919,802 | 7/1933 | Pfeiffer | 340/647 X |
| 2,422,288 | 6/1947 | Boynton | 340/647 X |
| 2,942,248 | 6/1960 | Huggins | 324/54 |
| 2,978,636 | 4/1961 | Fountain | 324/558 |
| 3,287,633 | 11/1966 | Mollo | 324/54 X |
| 3,413,541 | 11/1968 | Swim et al. | 324/54 |
| 3,548,302 | 12/1970 | Arnold et al. | 324/54 |
| 3,781,666 | 12/1973 | Dornberger | 324/54 |
| 3,789,295 | 1/1974 | Balchunas et al. | 324/54 |
| 3,823,370 | 7/1974 | Pendleton et al. | 324/54 |
| 3,970,924 | 7/1976 | Pendleton et al. | 324/54 |

OTHER PUBLICATIONS

NEMA Test Procedure—Apr., 1972,—Sections 2.3.3 and 2.3.4.1-2.
NEMA Continuity Test Procedure—Sep., 1973,—Sections 8.1.1.1-2.
NEMA Continuity Test Procedure–Sep., 1977,—Sections 8.1.1.1-2.
NEMA Publication Number MW1000—Oct., 1981, pp. 241-242—Sections 3.8.1.1-2.

Primary Examiner—Reinhard J. Eisenzopf
Assistant Examiner—Robert W. Mueller
Attorney, Agent, or Firm—Francis J. Maguire, Jr.

[57] ABSTRACT

The insulation of a plurality of grounded wires may be tested subsequent to fabrication and prior to spooling by use of a corresponding plurality of modular circuit boards installed in a continuity tester. Each modular circuit board has its own on board DC power supply and clock generator for enhancing isolation, thereby decreasing crosstalk between channels and reducing spurious "sympathetic" faults. AC or DC high voltage testing may be selected. Isolation is also enhanced by using a sheaves separated by teflon insulators, all mounted on a common rod.

7 Claims, No Drawings

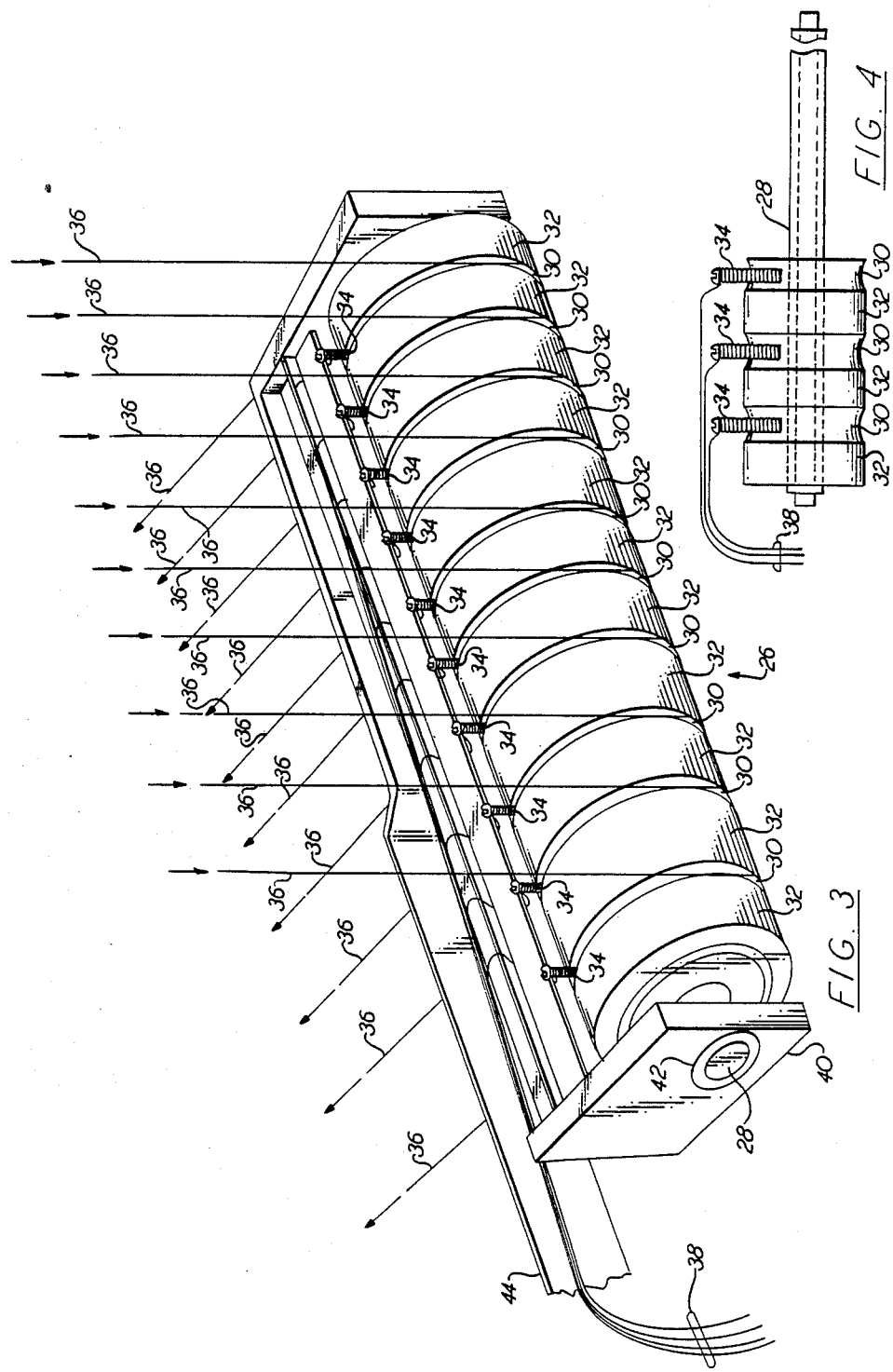

TEST

VOLT: _____ CAL: _____
OVEN: _____ SIDE: _____
DATE: _____ TIME: _____

| 1 | 2 | 3 | 4 | 5 | 6 | 7 | 8 | 9 | 10 |
|---|---|---|---|---|---|---|---|---|----|
| 0 | 0 | 0 | 0 | 0 | 0 | 0 | 0 | 0 | 5  |

| 0 | 0 | 0 | 0 | 0 | 0 | 0 | 0 | 5 | 0 |

*FIG. 7*

TEST

VOLT: _____ CAL: _____
OVEN: _____ SIDE: _____
DATE 1/1       TIME 0:01:18

| 1 | 2 | 3 | 4 | 5 | 6 | 7 | 8 | 9 | 10 |
|---|---|---|---|---|---|---|---|---|----|
| 5 | 0 | 0 | 4 | 1 | 0 | 5 | 1 | 6 | 10 |
| 1 | 1 | 0 | 2 | 3 | 3 | 2 | 1 | 1 | 0  |
| 1 | 1 | 0 | 0 | 0 | 0 | 1 | 1 | 2 | 2  |

*FIG. 8*

CONTINUITY TEST METHOD AND TEST CARD CIRCUIT

CROSS REFERENCE TO RELATED APPLICATION

The invention described herein may employ some of the teachings disclosed and claimed in a commonly owned co-pending application filed on the same date as this application by Graham et al, Ser. No. 868,967, now U.S. Pat. No. 4,740,756, entitled CONTINUITY TEST METHOD AND APPARATUS.

1. Technical Field

This invention relates to continuity testers for testing the insulation of insulated wire and, more particularly, to a circuit for use on a modular test card for use in a continuity tester having a plurality of test cards for testing a plurality of wires in parallel.

2. Background Art

Testing of insulated wire just after fabrication but prior to spooling for delivery usually involves passing the wire, under tension, over an energized roller or sheave in order to induce a fault current through any pinholes or other defects which may exist in the insulation. The wire itself is grounded so that the fault current can be detected by a sensing circuit.

For example, U.S. Pat. No. 3,413,541 entitled APPARATUS FOR DETECTING INSULATION FAULTS IN MAGNET WIRE UTILIZING FIELD EFFECT TRANSISTOR, issued Nov. 26, 1968 to W. A. Swim et al, discloses a test apparatus for detecting faults in the insulation coating of a moving insulated wire. As described by Swim et al, insulated wire such as magnet wire is produced in commercial quantities from bare copper wire by applying enamel to the bare wire and then curing by passing the wire through an enameling oven. To obtain the desired insulation "build," a preselected number of enameling passes are made. Fine magnet wire is built up at speeds of many hundreds of feet per second and many strands of wire may be fabricated in parallel at one time. In the Swim et al apparatus, a relatively high direct current potential is applied by a contact wheel to the surface of the insulation coating of the moving wire. The contact wheel is electrically connected to a voltage divider having a first branch connected to a DC source and a second branch connected to a sensing circuit utilizing a field effect transistor (FET) to detect changes in current through the insulation to ground. The FET is switched into a conducting state in response to a predetermined drop in the current flow in the second branch thereby indicating the occurrence of a fault in the insulation coating of the insulated wire. The current sensing circuit may be connected to a recorder, typically a stripchart recorder, or to another device for recording or counting the faults occurring in the wire insulation. The first branch preferably limits the current supplied to the contact wheel to a magnitude of not more than 25 microamps in order to provide a test apparatus which is essentially ignition proof to prevent sparks, presumably in an inflammable gaseous environment. Swim et al also disclose that the sensing circuit may be mounted on a plug-in circuit board to facilitate maintenance and replacement of parts. The plug-in circuit board is designed with a field effect transistor sensing circuit which also presumably helps provide a high signal-to-noise ratio.

However, the plug-in circuit board disclosed by Swim et al is connected to a separate DC power supply which presumably supplies all other plug-in circuit boards for testing other wires in separate channels. This provides an undesirable potential for cross talk between channels, which may set off "sympathetic" faults in channels adjacent to a channel in which a true fault occurs.

Swim et al also discloses use of a strip chart recorder which introduces the difficulty of having to examine many feet of paper which can be time consuming, since production in modern plants is carried out around the clock and therefore testing must be accomplished at frequent periodic intervals involving much expenditure of time in examining stripcharts.

Most of the testers presently in use utilize DC for testing insulation. However, AC testing has been found to be more effective in detecting faults for some applications.

It would therefore be desirable to increase the isolation of separate channel circuit boards and to provide fault signal outputs suitable for digital storage and display in order to eliminate the need to devote substantial amounts of time in examining analog strip chart records. It would also be desirable to provide circuit boards which are capable of operating with either high voltage AC or DC.

DISCLOSURE OF THE INVENTION

An object of the present invention is to increase isolation between testing channels in a multi-wire testing apparatus. Another object of the present invention is to reduce the amount of time devoted to interpretation of data gathered. Still another object of the present invention is to increase the versitility of testing methods.

According to the present invention, a method and apparatus for testing the insulation of a wire is provided in which the wire is grounded and pulled, under tension, over a rotating metal roller or sheave energized with a high voltage signal so as to cause a current to flow through the insulation and the wire to ground. The current induced by the high voltage signal is provided to a modular circuit board having a sensing circuit for generating a sensing voltage having a magnitude proportional to the magnitude of the current through the insulation. In order to increase isolation between channels, a low voltage AC input signal is provided to the circuit board and a regulated DC voltage signal is generated in response to the low voltage AC input signal. A reference voltage is generated from the regulated DC which is compared to the sensed voltage. The level of the reference voltage is selected to correspond to a sensing voltage indicative of a fault condition. In the presence of a comparison indicating such a fault condition, a fault signal is provided by the circuit board at an output thereof.

In further accord with the present invention channel isolation is enhanced further in a multi-wire testing environment by providing a test head with metal sheaves mounted on a rod having teflon insulators as spacers.

In still further accord with the present invention, the versatility of the test method is enhanced by providing that the high voltage applied to the insulated wire may be either AC or DC.

In still further accord with the present invention, the low voltage AC input signal is rectified and coupled using an optical coupler to a squarewave generator in order to provide an individual clock signal to a delay flip-flop which is also responsive to the fault signal. The delay flip-flop provides a delayed fault signal suitable for reception by a digital signal processor.

The method and apparatus of the present invention provides the desired versatility, isolation of test channels and also provides a digital output signal for use by a digital signal processor for gathering data which reduces the time consuming task of interpretating analog strip chart data, as practiced in the prior art.

These and other objects, features and advantages of the present invention will become more apparent in light of the detailed description of a best mode embodiment thereof, as illustrated in the accompanying drawing.

BRIEF DESCRIPTION OF THE DRAWING

FIG. 3 is a perspective illustration of a test head for applying a high voltage signal to a plurality of wires just after fabrication and just prior to spooling;

FIG. 4 is a simplified illustation of the head of FIG. 3 and how it is assembled;

FIG. 7 is an illustration of a printout from the printer of FIG. 2; and

FIG. 8 is another version of a printout from the printer of FIG. 2.

BEST MODE FOR CARRYING OUT THE INVENTION

Figure 1:
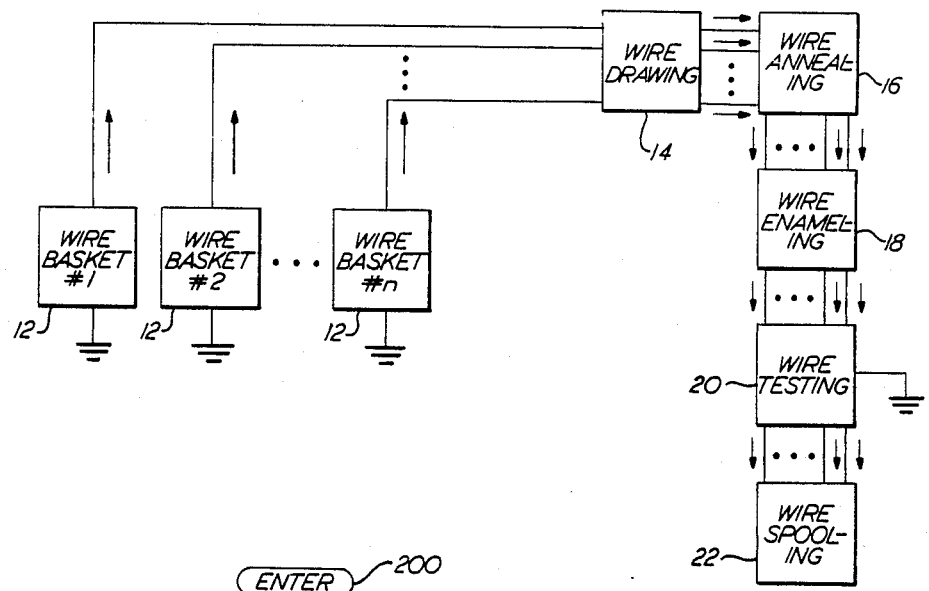
FIG. 1 is an illustration of a wire fabrication process including various steps including a wire testing step, carried out according to the method of the present invention.

FIG. 1 is a simplified block diagram illustration of a wire fabrication process in which bare copper wire is coiled in a plurality of wire baskets 12 from which wire is taken into and drawn down to a smaller diameter in a wire drawing apparatus 14. Annealing next takes place in an annealing apparatus 6. After annealing, the wire is coated with enamel and baked in an anameling apparatus 18. After enameling the wire is tested using wire testing apparatus 20, according to the present invention, and then spooled on individual spools in a wire spooling apparatus 22. Each wire is connected throughout the process to the remaining wire in its source basket and a hard earth ground is made in each basket to the wire therein. The wire testing method separately applies a test voltage to the surface of the insulation of each wire and measures the current flowing through the insulation and through the wire to ground. Thus, the wire testing apparatus 20 of FIG. 1 is also shown as grounded in order to complete the testing circuit as will be more fully disclosed in connection with FIGS. 2 and 5.

Figure 2:
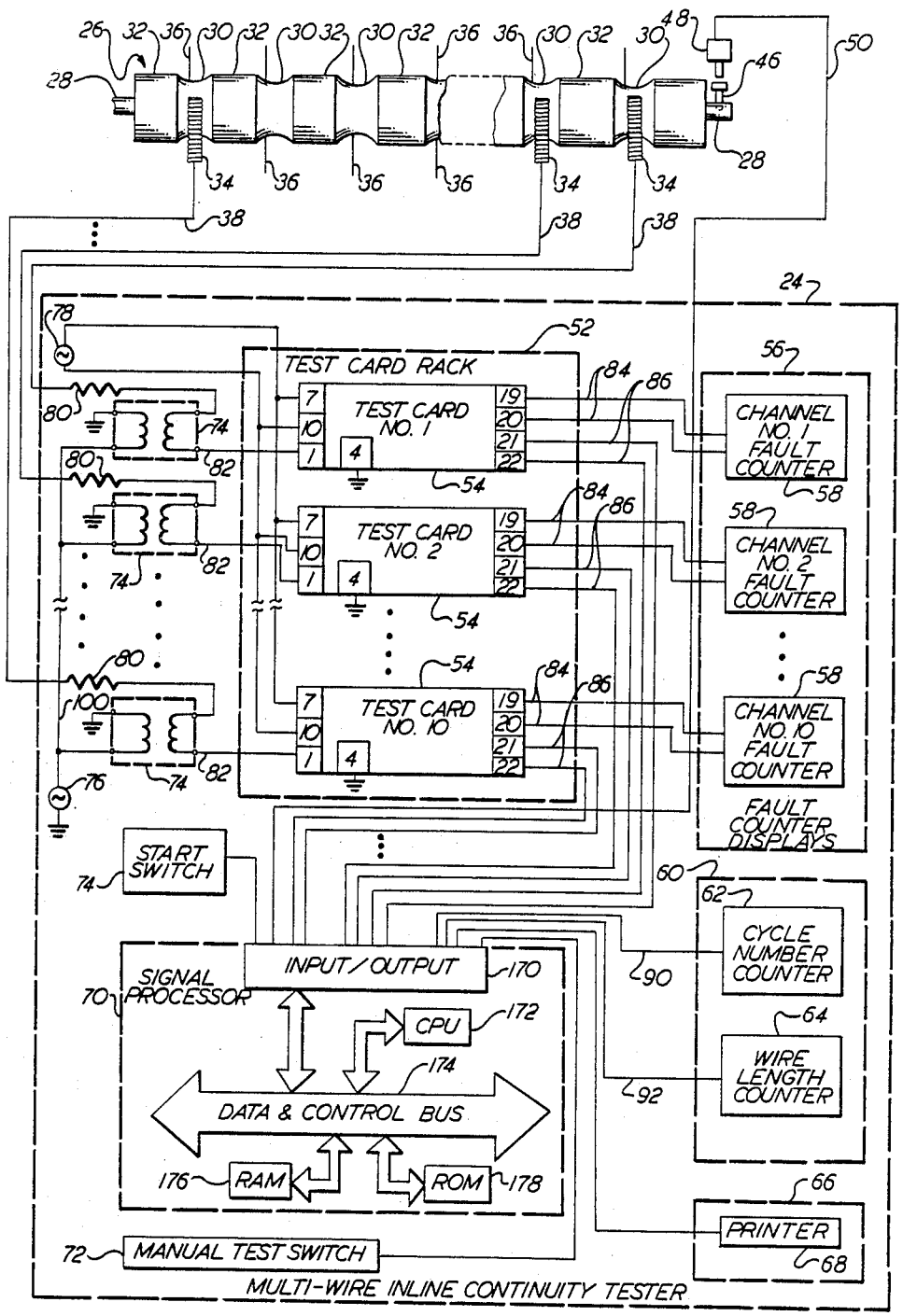
FIG. 2 is a simplified block diagram illustration of an apparatus for use in carrying out the wire testing method of the present invention.

FIG. 2 is a simplified block diagram illustration of a multi-wire in-line continuity tester for use in conjunction with a test head 26 in carrying out the method according to the present invention.

The test head 26 comprises a rod 28 upon which is mounted a series of metal sheaves 30 separated by a plurality of teflon spacers 32. The sheaves are individually energized by separate sliding contacts 34 which, in the illustration of FIG. 2, provide high voltage AC signals to the sheaves. Each sheave separately contacts one of the individual wires 36 with a rolling contact. The individual wires are under tension and make a good rolling contact with the surface of their associated sheaves. The sliding contacts 34 of FIG. 2 are shown as compression springs which may be positioned so as to make a good sliding contact with a sheave. Of course, many other variations of sliding contacts may be used including a leaf spring arrangement or carbon brushes similar to those used on slip rings. The springs 34 are shown each having an associated wire 38 connected to the multi-wire in-line continuity tester 24. This wire brings the high voltage signal from the tester 24 to the test head.

FIG. 3 is a perspective illustration of the test head of FIG. 2 installed on a support bracket 40 having a bearing 42 at each end of the bracket for supporting the rod 28. The springs 34 are shown in FIG. 3 behind the test head and the high voltage wires 38 are shown in a special conduit within an arm 44 which extends from the multi-wire in-line continuity tester 24 in a portable embodiment thereof. Of course, the test head may be permanently installed before spooling in the fabrication line instead. The wires 38 may be shielded for isolation purposes. The direction arrows pictured in FIG. 3 are associated with the wires 36 under test and are shown coming from the enameling apparatus 18 of FIG. 1 and heading toward the wire spooling apparatus 22, also of FIG. 1.

FIG. 4 is a simplified illustration showing the assembly of several sheaves onto a rod 28 and separated by teflon spacers 32. Several springs 34 and associated wires 38 are also illustrated. The construction of the test head of FIGS. 2, 3 and 4 is particularly advantageous from the point of view of helping to establish good isolation between test channels to prevent spurious cross-talk between channels while, at the same time, providing a compact and simple design.

Returning to FIG. 2, the test head rod 28 is shown having a bolt 46 attached thereto by means of threading engagement with a threaded shaft in rod 28. As the test head rotates, the bolt 46 rotates as well and may be used to measure the length of wire which has passed by, by means of a proximity sensor 48 having a wire 50 connecting it to the multi-wire in-line continuity tester 24. The use of the signal generated by the proximity sensor will be discussed in more detail subsequently. Of course, it will be realized that an existing bolt on any other rotating member in the wire fabrication process could be used as well and, needless to say, the bolt 46 could be located on virtually any rotating member in the fabrication process. Alternatively, other methods of measuring the amount of wire tested may also be utilized.

The multi-wire in-line continuity tester 24 of FIG. 2 includes a test card rack 52 having a plurality of test cards 54 therein, each associated with one of the wires 36 undergoing test. The continuity tester 24 also includes a display module 56 having a plurality of channel fault counters 58, another display module 60 having a cycle number counter 62 and a wire length counter 64, a printer module 66 having a printer 68, a signal processor 70, a manual test switch 72, a start switch 74, a plurality of transformers 74, a high voltage AC supply 76 and a low voltage AC supply 78.

The primary of each transformer 74 is responsive to excitation from the AC source 76 and provide, at the secondaries, a stepped up high voltage AC which is in turn provided to the sliding contacts 34 on the test heads via the connecting wires 38. The AC source 76 may, for example, be 120 VAC and the secondary voltage may be 3000 VAC, due to, for this example, a 1:25 step-up ratio. The current flowing on the secondary sides is limited by limiting resistors 80 which normally are on the order of several megohms, e.g., 4.7 megohms, for a three thousand volt AC excitation signal, in order to limit fault currents to safe levels.

Any current flowing through the insulation to ground is also conducted on an associated line 82 into a corresponding test card to an associated sensing circuit within the test card. Upon detecting a level of current which corresponds to a defined fault level, the test card will provide a pair of output fault signals on a corresponding pair of signal line pairs 84, 86. The first signal line pair 84 is provided to an associated channel fault counter 58 in the fault counter display module 56. This provides a visual running total for personnel who may happen to be monitoring the progress of the test. The counters 58 may, for example, be CUB1 or CUB2 type counters made by Red Lion Controls of York, Penn. The second signal line pair 86 is provided to the signal processor 70 where it is processed by storing and counting for later printout on the printer 68 at the conclusion of the test. I.e., the total number of faults for each channel is counted up and stored and later printed out as a total for each channel.

The test is normally run every hour and tests three successive 100 foot lengths of wire. These are referred to as cycles and the present cycle number is displayed on the cycle number counter 62 which receives an output signal from the signal processor on a line 90. Thus, if three cycles are being run, the cycle number counter will display either a 1, 2 or 3. The wire length counter 64 provides an indication of what part of the 100 foot length of wire is presently under test. This count is obtained by reference to the signal on the line 50 from the proximity sensor 48. Thus, a signal on a line 92 from the signal processor may provide 100 count pulses indicating the number of feet tested in the present cycle. If, for example, three rotations of the test head 26 corresponds to one foot of wire, there will be three pulses on the line 50 for every pulse provided on line 92 to the wire length counter 64. The signal processor, of course, provides the calculation via a subroutine in its main algorithm. The cycle number counter merely counts the number of hundred foot lengths which have been tested and may similarly be handled by a small subroutine in the main program. Both the cycle number and wire length counters may, for example, be CX300 Series Microprocessor Based Solid State Timer/Counters made by Eagle Signal Controls of Davenport, Iowa.

An automatic test feature may be started with a start switch 74 which causes the continuity tester 24 to go through a cycle of testing every hour or at any selected interval of time or wire length. If it is desired to run a test and observe the results visually as the test is actually conducted, the manual test switch 72 may be activated.

The low voltage AC supply 78 may, for example be 6 VAC and is provided to the test cards, in accordance with the present invention, in order to permit isolated generation of the internal reference voltage for each card in order to assure highly individualized and isolated test channels.

Figure 5:
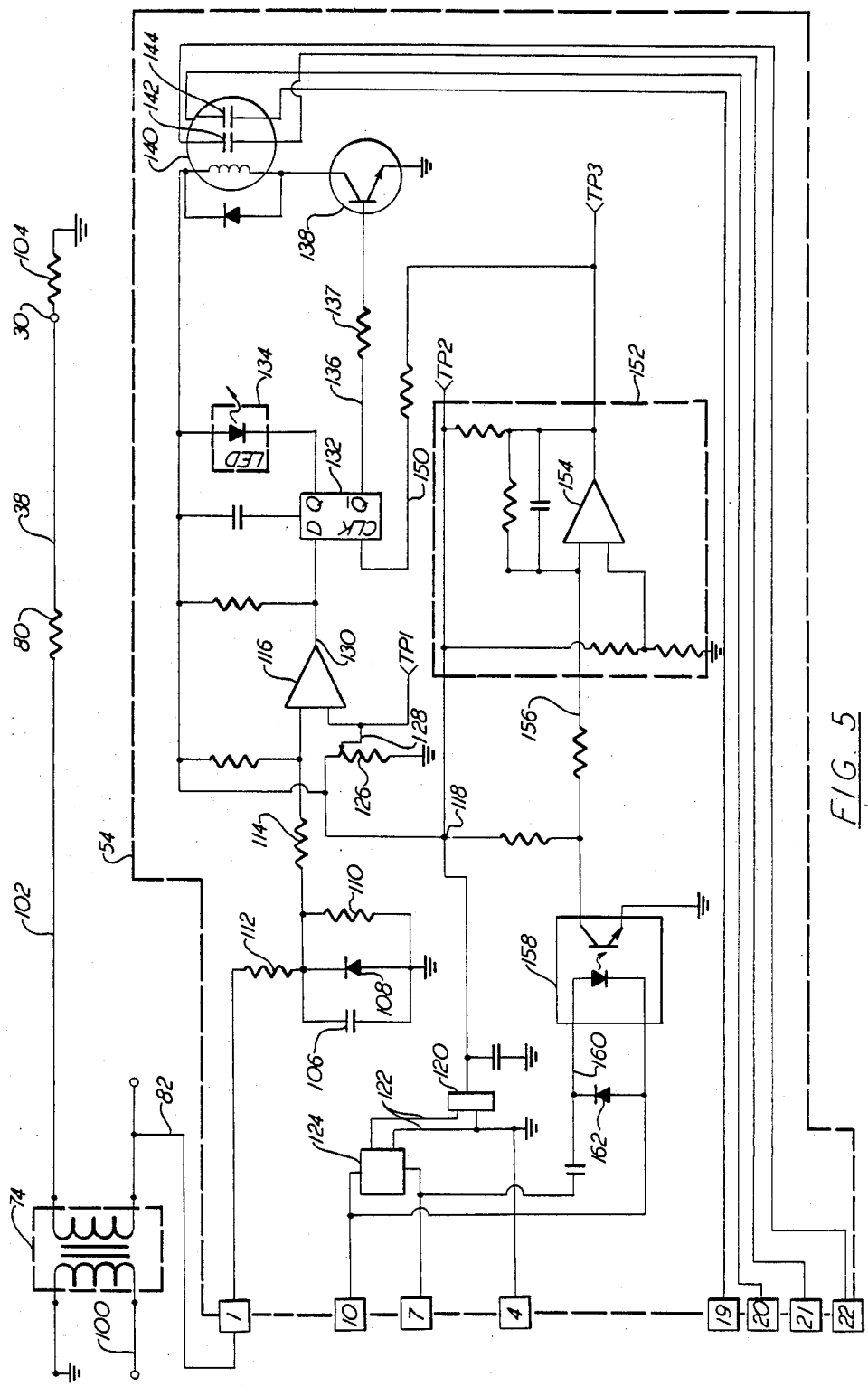
FIG. 5 is a simplified schematic block diagram illustration of a modular printed circuit board for use in carrying out the method of the present invention.
Figure 1:
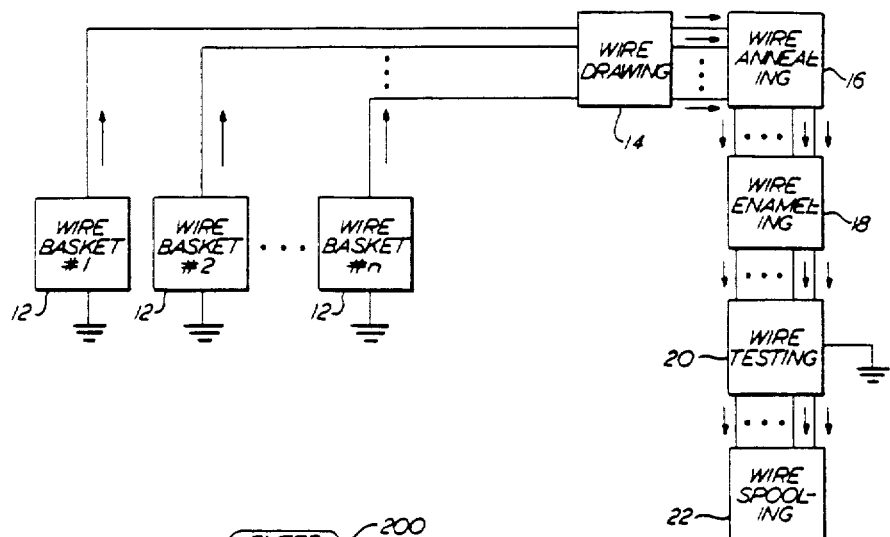
Figure 6:
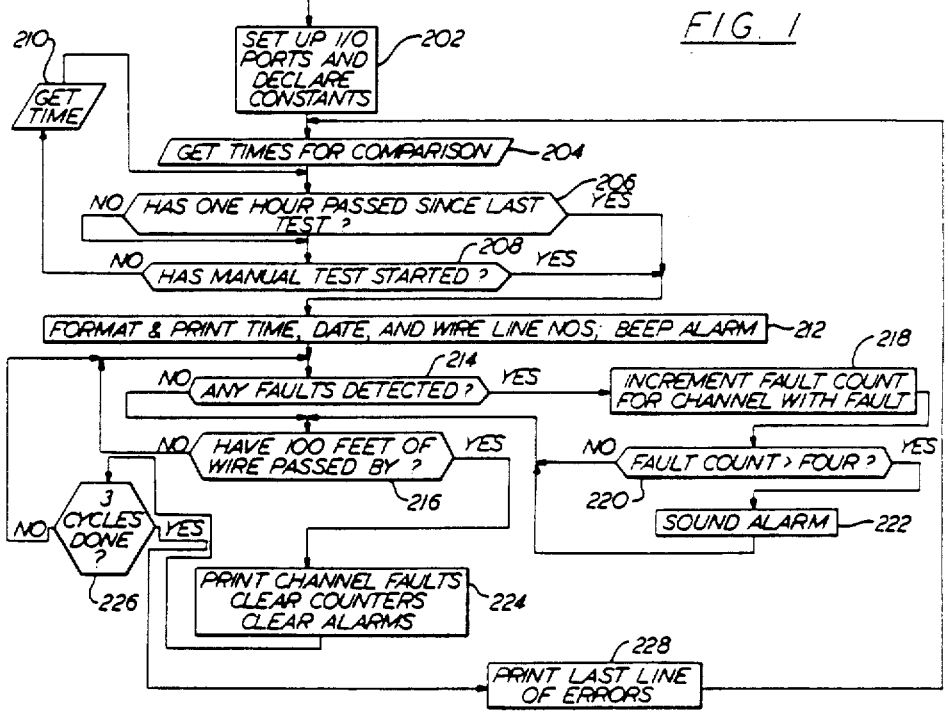
Figure 2:
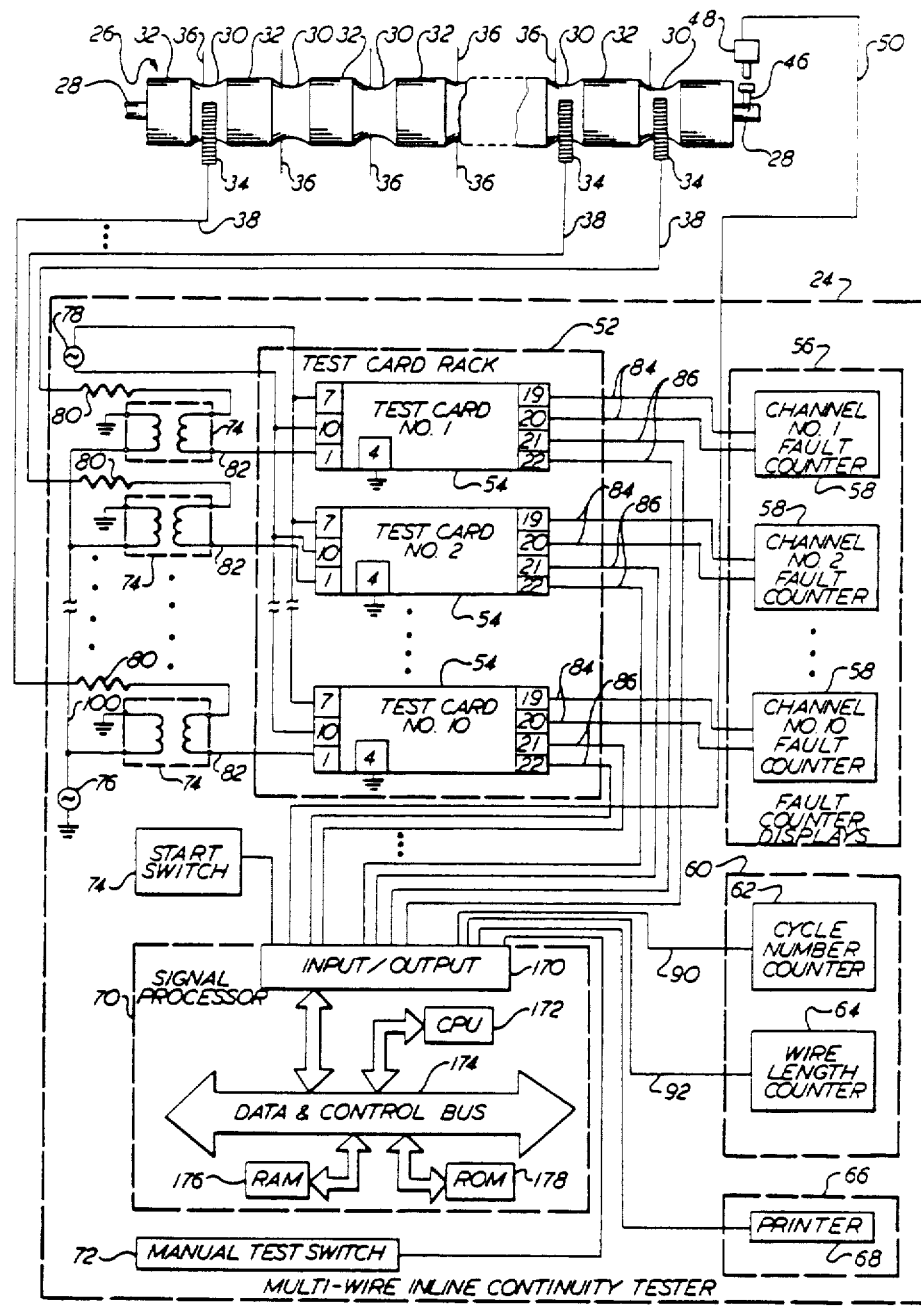
Figure 5:
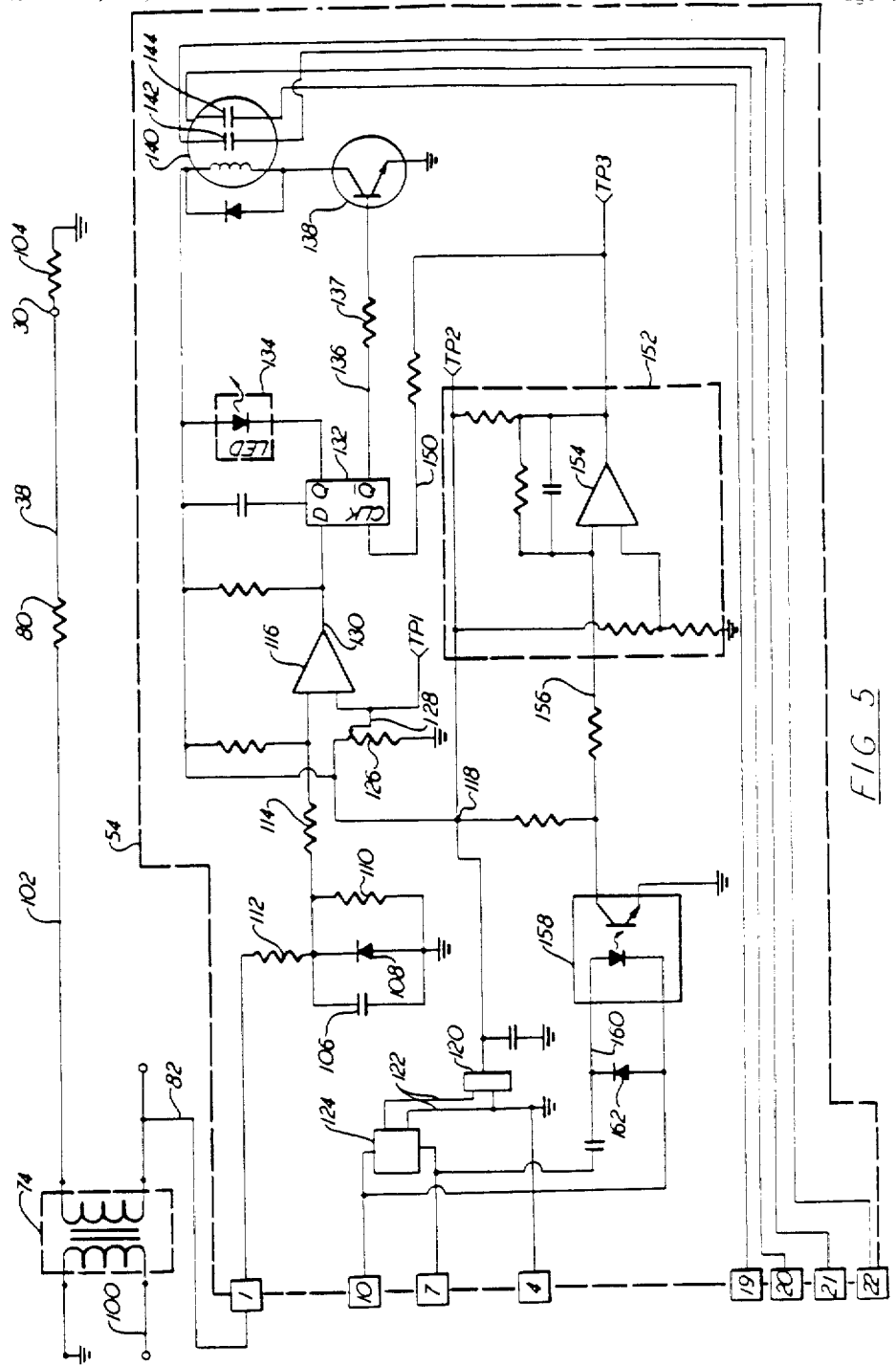

The manner in which the test cards operate may now be examined in more detail by reference to FIG. 5. There, a typical test card 54 is shown in detail. The terminal numerals for external hook-up are shown in square boxes which are also reproduced in FIG. 2 which shows the external hook-up to those terminals.

As discussed in connection with FIG. 2, a transformer 74 is responsive on a line 100 to the high voltage AC source 76. This voltage is stepped up even higher at the secondary so that a high voltage AC on the order of several thousand volts is applied to a current limiting resistor 80. A line 38 provides the test voltage to the sheave 30 in contact with the insulation resistance 104 of the wire, which is grounded. The other side of the secondary is connected, via a wire 82, to terminal designated number 1 on the test card 54. This, in turn, is connected to a sensing circuit comprising a capacitor 106, a diode 108 and a resistor 110 in parallel. This sensing circuit is in series with a resistor 112 and the voltage across the sensing circuit is applied, through a resistor 114, to one input of a voltage comparator 116 which may be one half of an LM139. A DC voltage is developed at a node 118 by a DC regulator 120 fed with a rectified DC on a pair of lines 122 from a bridge rectifier 124 which, in turn, is supplied by the low voltage AC source 78 of FIG. 2 (which is connected at input terminals number 10 and number 7). The DC voltage at node 118 is supplied to a potentiometer 126 having a wiper arm 128 which is adjustable over a range to provide a continuously variable DC reference level at the other input of the comparator 116. A test point (TP) is provided on the card for easy calibration of the reference level.

Upon sensing a miscomparison, the comparator 116 provides a fault signal on a line 130 to a delay type flip-flop 132 which may be of the type 74LS74. The Q output of the flip-flop is provided to a light emitting diode 134 which provides a visual indication of a fault on that particular channel. The not Q output is provided on a line 136 through a resistor 137 to a transistor switch 138 which turns on the transistor in the presence of a fault. This in turn causes the coil of a relay 140 to become energized closing two normally open contacts 140, 144. In the embodiment shown in FIG. 2, contact 142 is used for providing a fault indication to the signal processor 70 while contacts 144 are used for providing a visual indication to a channel fault counter in the fault counter display 56.

The flip-flop 132 is clocked on a line 150 by a clock generator 152. The clock generator comprises the other half 154 of the LM139 chip and squares up and filters out any noise which may exist on an opto-coupled signal on a line 156 provided by an opto-coupler 158 which, in turn, is responsive to a rectified signal on a line 160. A diode 162 rectifies the low voltage AC signal provided on terminals 10 and 7 of the test card 54.

It is an important aspect of the present invention that the test card of FIG. 5 may be used with either a high voltage AC test signal on line 102 or a high voltage DC signal in lieu thereof. By simply removing the transformer 74 and making lines 102 and 82 common, a high DC voltage can be applied to the resulting common node and the circuit will work equally well with DC as the test voltage. Everything else remains the same.

Referring now back to FIG. 2, it will be observed that the signal processor 70 is shown in simplified form as including an input/output port 170, a central processing unit (CPU) 172, a data and control bus 174, a random access memory (RAM) and a read only memory (ROM) 178. Thus, the signal processor 70 may be thought of as a general purpose computer, although a special purpose computer will do as well. The signal processor may of course be of any type but would probably be selected from among the wide variety of low cost general purpose computer cards available for OEMs such as the Octagon 880 card having a signal processor installed which operates its own proprietary form of the BASIC programming language known as ROBASIC.

Figure 6:
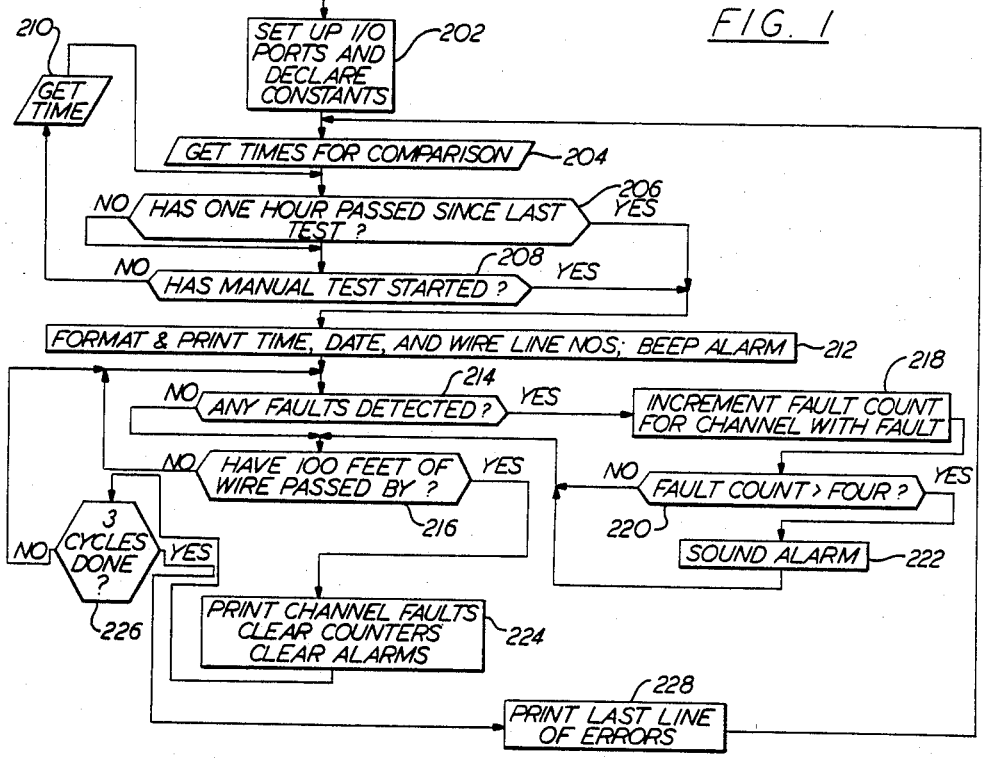
FIG. 6 is a block diagram illustration of the steps which may be carried out on the signal processor of FIG. 2 for use in carrying out the inventive concepts disclosed herein.

Referring now FIG. 6, a flowchart is there illustrated in simplified form for carrying out the steps necessary to implement the inventive concepts disclosed herein in the signal processor 70 of FIG. 2. A ROBASIC program corresponding to the flowchart of FIG. 6 is presented in the appendix. Of course, it will be understood that the flowchart is general and the specific program in the appendix is specific to a particular card.

A step 200 is first executed in which entry to the sequential set of steps is first initiated, for example, after depressing the manual test switch 72 of FIG. 2. A step 202 is next executed in which the I/O ports are set up and constants are declared. A step 204 is next executed in which the present time and date is obtained from a running clock and calendar. A step 206 is next executed in which a determination is made as to whether or not one hour has passed since the last test. If not, a step 208 is next executed in which a determination is made as to whether or not a manual test sequence has been started (by depression of manual test switch 72). If not, the present time is obtained in a step 210 and step 206 is again executed. If one hour has passed, a step 212 is next executed in which the time, date, and wire line numbers are formatted and printed on printer 68 and an alarm may be sounded, if used. A step 214 is next executed in which a determination is made as to whether any faults have been detected since last checked. If not, a determination is made in a step 216 as to whether or not 100 feet of wire have passed by the sensing head 26. If not, step 214 is again executed. If a fault is detected in step 214, a step 218 is executed in which the channel in which the fault is detected has its fault counter incremented both on the fault counter display 56 and on an internal fault counter within the signal processor 70. A step 220 is next executed in which the present fault count is compared to the number 4. If greater, i.e., if 5 or more faults exist an alarm is sounded in a step 222. If less than 5 counts are found step 216 is executed directly to determine whether the present cycle is over or not. If so, a step 224 is next executed in which the channel faults are printed, counters are cleared and any existing alarms are cleared. A step 226 is next executed in which a determination is made as to whether 3 cycles have been completed or not. If not, step 214 is again executed and the previously described sequences of tests are repeated until 3 cycles are finished. If the step 226 determines that 3 cycles have been completed a step 228 is next executed in which the last line of errors is printed. The sequence of steps is then repeated beginning again at step 204, and so on.

Referring now to FIGS. 7 and 8, two variations of the printer 68 output are shown. The total number of faults for each of 10 channels are printed out in both FIGS. 7 and 8. It will be noted that some channels have no faults while others have one or more faults. Some channels even have 5 or more faults which may be considered an alarm condition. Of course, depending on the particular test configuration and plant, the identification information left blank in FIGS. 7 and 8 will be filled in by the signal processor which will have this information in memory.

The invention having been shown and described with respect to a best mode embodiment thereof, it should be understood by those skilled in the art that the foregoing and various other changes, omissions, and additions in the form and detail thereof may be made therein without departing from the spirit and scope of the invention.

APPENDIX

I/O PORT SETUP

```
10 MPUT 0C000H,22H
20 MPUT 0C002H,08H
30 MPUT 0C006H,00H
40 MPUT 0C008H,70H
50 PORT1=0C010H
60 PORT2=0C012H
70 MPUT PORT1,00H:MPUT PORT2,00H:
```

WAIT LOOP AND AUTO START FUNCTION

```
80 GTIME SEC,MIN,HR
90 GTIME ASEC,AMIN,AHR
100 IF HR+1= 24 THEN HR=HR−24
110 IF AHR=HR+1 THEN GOTO 140
120 P2=MGET(PORT2) :IF (P2 AND 64) =64 THEN GOTO 140
130 GOTO 90
140 MPUT PORT1,30H
150 DELAY 200:MPUT PORT1.00H
```

COMPUTATION FOR MONTH AND DATE FOR PRINTER (MM/DD/)

```
160 GDATE CDATE
170 MONTH=0
180 MONTH=MONTH+CDATE/30
190 MONTH=MONTH+1
200 DAY=1+CDATE MOD 30
210 PRINT:PRINT"DATE ";MONTH;"/";DAY;"  TIME ";TIME$
220 S=1:FOR I=1 TO 10:
230 PRINT S; " ";
240 INC S
250 NEXT I
260 PRINT:
```

THIS IS THE MAIN BODY OF THE PROGRAM. ERROR SCAN

| -continued |
|---|
| APPENDIX |
| AND ERROR COUNT ARE CONTAINED HERE. |

```
270 P1=MGET(PORT1) :P2=MGET(PORT2):
280 IF (P1 AND 1) =1 THEN F1=1
290 IF (P1 AND F1 AND1)=1 THEN GOTO 310
300 IF (F1 AND 1)=1 THEN C1=C1+1:F1=0
310 IF (P1 AND 2) =2 THEN F2=2
320 IF (P1 AND F2 AND 2)=2 GOTO 370
330 IF (F2 AND 2)=2 THEN C2=C2+1:F2=0
340 IF (P1 AND 4) =4 THEN C3=C3+1:F3=0
350 IF (P1 AND F3 AND 4) =4 THEN GOTO 370
360 IF (F3 AND 4)=4 THEN C3=C3+1:F3=0
370 IF (P1 AND 8)=8 THEN F4=8
380 IF (P1 AND F4 AND 8)=8 THEN GOTO 400
390 IF (F4 AND 8)=8 THEN C4=C4+1:F4=0
400 IF (P1 AND 128)=128 THEN F5=128
410 IF (P1 AND F5 AND 128)=128 THEN GOTO 430
420 IF (F5 AND 128)=128 THEN C5=C5+1:F5=0
430 IF (P2 AND 1)=1 THEN F6=1
440 IF (P2 AND F6 AND 1)=1 THEN GOTO 460
450 IF (F6 AND 1)=1 THEN C6=C6+1:F6=0
460 IF (P2 AND 2)=2 THEN F7=2
470 IF (P2 AND F7 AND 2)=2 THEN GOTO 490
480 IF (F7 AND 2)=2 THEN C7=C7+1:F7=0
490 IF (P2 AND 4)=4 THEN F8=4
500 IF (P2 AND F8 AND 4)=4 THEN GOTO 520
510 IF (F8 AND 4)=4 THEN C8=C8+1:F8=0
520 IF (P2 AND 8)=8 THEN F9=8
530 IF (P2 AND F9 AND 8)=8 THEN GOTO 550
540 IF (F9 AND 8)=8 THEN C9=C9+1:F9=0
550 IF (P2 AND 16)=16 THEN F10=16
560 IF (P2 AND F10 AND 16)=16 THEN GOTO 580
570 IF (F10 AND 16)=16 THEN C10=C10+1:F10=0
580 IF (P2 AND 32)=32 THEN GOSUB 620
590 IF (P2 AND 64)  64 THEN GOTO 80
              PRINTER SUBROUTINE
600 IF C1ORC2ORC3ORC4ORC5ORC6ORC7ORC8ORC9ORC10 4 THEN MPUT PORT1,20H
610 GOTO 270
620 DELAY 40
630 DIM S$(1)
640 S$=" "
650 PRINT C1;S$;C2;S$C3;S$;C4;S$;C5;S$;C6;S$;C7;S$;C8;S$;C9;S$;C10;CHR$(13);
660 C1=0:C2=0:C3=0:C4=0:C5=0:C6=0:C7=0:C8=0:C9=0:C10=0:
670 MPUT PORT1,00H
680 RETURN
```

I claim:

1. A method for testing the insulation of a wire, comprising the steps of:
   grounding the wire;
   pulling the wire, under tension, over a rotating metal roller;
   energizing the roller with a high voltage signal so as to cause a current to flow through the insulation and the wire;
   providing said current to a modular circuit board having a sensing circuit responsive thereto for generating a sensing voltage having a magnitude proportional to the magnitude of said current;
   providing a low voltage AC input signal to said board;
   providing, on said board, a regulated DC voltage signal in response to said low voltage AC input signal;
   providing, on said board, a reference voltage signal at a magnitude proportional to the magnitude of said regulated DC voltage;
   comparing, on said board, the magnitude of said sensing voltage to said reference voltage signal; and
   providing, on said board, a fault signal in the presence of a comparison of the magnitudes of said sensing and reference signals indicative of a fault condition.

2. The method of claim 1, wherein said high voltage signal is AC.

3. The method of claim 1, wherein said high voltage signal is DC.

4. The method of claim 1, further comprising the steps of:
   rectifying, on said board, said low voltage AC input signal and providing a rectified signal;
   coupling, on said board, said rectified signal using an optical coupler responsive to said rectified signal for providing an isolated rectified signal;
   generating, on said board, a clock signal using a squarewave generator circuit responsive to said isolated rectified signal;
   providing, on said board, said clock signal to a delay flip-flop responsive both to said clock signal and to said fault signal for providing a delayed fault signal.

5. A wire insulation test card, comprising:
   a sensing circuit, responsive to a current through a wire's insulation induced by a high voltage signal, for providing a sensed signal indicative of the magnitude of said current;
   a bridge rectifier, responsive to a low voltage AC signal for providing a bridge rectified signal;
   regulator means, responsive to said bridge rectified signal for providing a regulated DC voltage signal; and
   a voltage divider, responsive to said regulated DC voltage signal for providing a reference signal;

means for comparing the magnitude of said sensed signal to the magnitude of said reference signal for providing a fault signal in the presence of a comparison of the magnitudes of said sensing and reference signals indicative of a fault condition.

6. The test card of claim 5, further comprising:

a rectifier, responsive to said low voltage AC signal for providing a rectified signal;

an opto-coupler, responsive to said rectified signal for providing an isolated rectified signal;

a squarewave generator circuit, responsive to said isolated rectified signal for providing clock signal pulses;

a delay flip-flop, responsive to both said clock signal pulses and to said fault signal for providing said fault signal delayed by one clock pulse; and a relay, responsive to said delayed fault signal for activating a related relay contact in response thereto.

7. The test card of claim 5, wherein said sensing circuit comprises a capacitor, a diode and a resistor in parallel.

* * * * *

UNITED STATES PATENT AND TRADEMARK OFFICE
CERTIFICATE OF CORRECTION

PATENT NO. : 4,786,876

DATED : November 22, 1988

INVENTOR(S) : Randall C. Graham

It is certified that error appears in the above-identified patent and that said Letters Patent is hereby corrected as shown below:

On the first page of patent, delete "7 Claims, No Drawings" and insert -- 7 Claims, 5 Drawing Sheets --.

Between first page of patent and Column 1, insert five sheets of drawings, Figs. 1-8. Five sheets of drawings are attached.

In the Abstract, line 10, after "a" insert -- simple and compact test head with a plurality of --.

Column 2, line 34, delete "versitility" and insert -- versatility --.

Column 3, line 8, delete "interpretating" and insert -- interpreting --.

Column 3, line 27, delete "illustation" and insert -- illustration --.

Column 3, line 48, "6" should be -- 16 --.

Column 3, line 49, delete "anameling" and insert -- enameling --.

Signed and Sealed this

Eleventh Day of April, 1989

Attest:

DONALD J. QUIGG

Attesting Officer

Commissioner of Patents and Trademarks

United States Patent [19]

Graham

[11] Patent Number: 4,786,876
[45] Date of Patent: * Nov. 22, 1988

[54] CONTINUITY TEST METHOD AND TEST CARD CIRCUIT

[75] Inventor: Randall C. Graham, Nashville, Tenn.

[73] Assignee: Essex Group, Inc., Fort Wayne, Ind.

[*] Notice: The portion of the term of this patent subsequent to Apr. 26, 2005 has been disclaimed.

[21] Appl. No.: 868,968

[22] Filed: May 30, 1986

[51] Int. Cl.⁴ .............................................. G01R 31/12
[52] U.S. Cl. .................................... 324/551; 324/544; 340/647
[58] Field of Search ............... 324/51, 54, 509, 551, 324/541, 544, 557, 558, 559; 340/647

[56] References Cited

U.S. PATENT DOCUMENTS

| | | | |
|---|---|---|---|
| 1,919,802 | 7/1933 | Pfeiffer | 340/647 X |
| 2,422,288 | 6/1947 | Boynton | 340/647 X |
| 2,942,248 | 6/1960 | Huggins | 324/54 |
| 2,978,636 | 4/1961 | Fountain | 324/558 |
| 3,287,633 | 11/1966 | Mollo | 324/54 X |
| 3,413,541 | 11/1968 | Swim et al. | 324/54 |
| 3,548,302 | 12/1970 | Arnold et al. | 324/54 |
| 3,781,666 | 12/1973 | Dornberger | 324/54 |
| 3,789,295 | 1/1974 | Balchunas et al. | 324/54 |
| 3,823,370 | 7/1974 | Pendleton et al. | 324/54 |
| 3,970,924 | 7/1976 | Pendleton et al. | 324/54 |

OTHER PUBLICATIONS

NEMA Test Procedure—Apr., 1972,—Sections 2.3.3 and 2.3.4.1–2.
NEMA Continuity Test Procedure—Sep., 1973,—Sections 8.1.1.1–2.
NEMA Continuity Test Procedure-Sep., 1977,—Sections 8.1.1.1–2.
NEMA Publication Number MW1000—Oct., 1981, pp. 241–242—Sections 3.8.1.1–2.

Primary Examiner—Reinhard J. Eisenzopf
Assistant Examiner—Robert W. Mueller
Attorney, Agent, or Firm—Francis J. Maguire, Jr.

[57] ABSTRACT

The insulation of a plurality of grounded wires may be tested subsequent to fabrication and prior to spooling by use of a corresponding plurality of modular circuit boards installed in a continuity tester. Each modular circuit board has its own on board DC power supply and clock generator for enhancing isolation, thereby decreasing crosstalk between channels and reducing spurious "sympathetic" faults. AC or DC high voltage testing may be selected. Isolation is also enhanced by using a sheaves separated by teflon insulators, all mounted on a common rod.

7 Claims, No Drawings

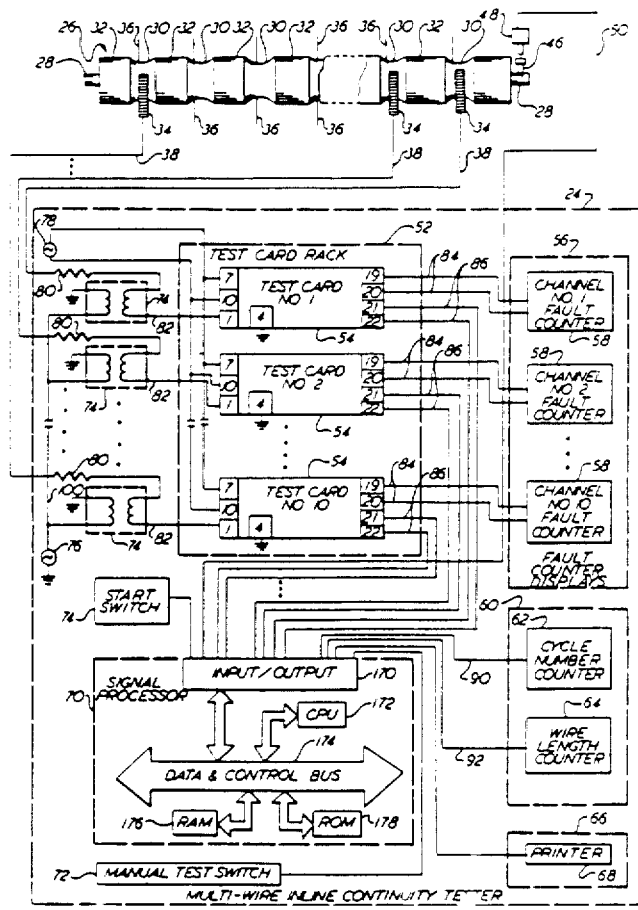

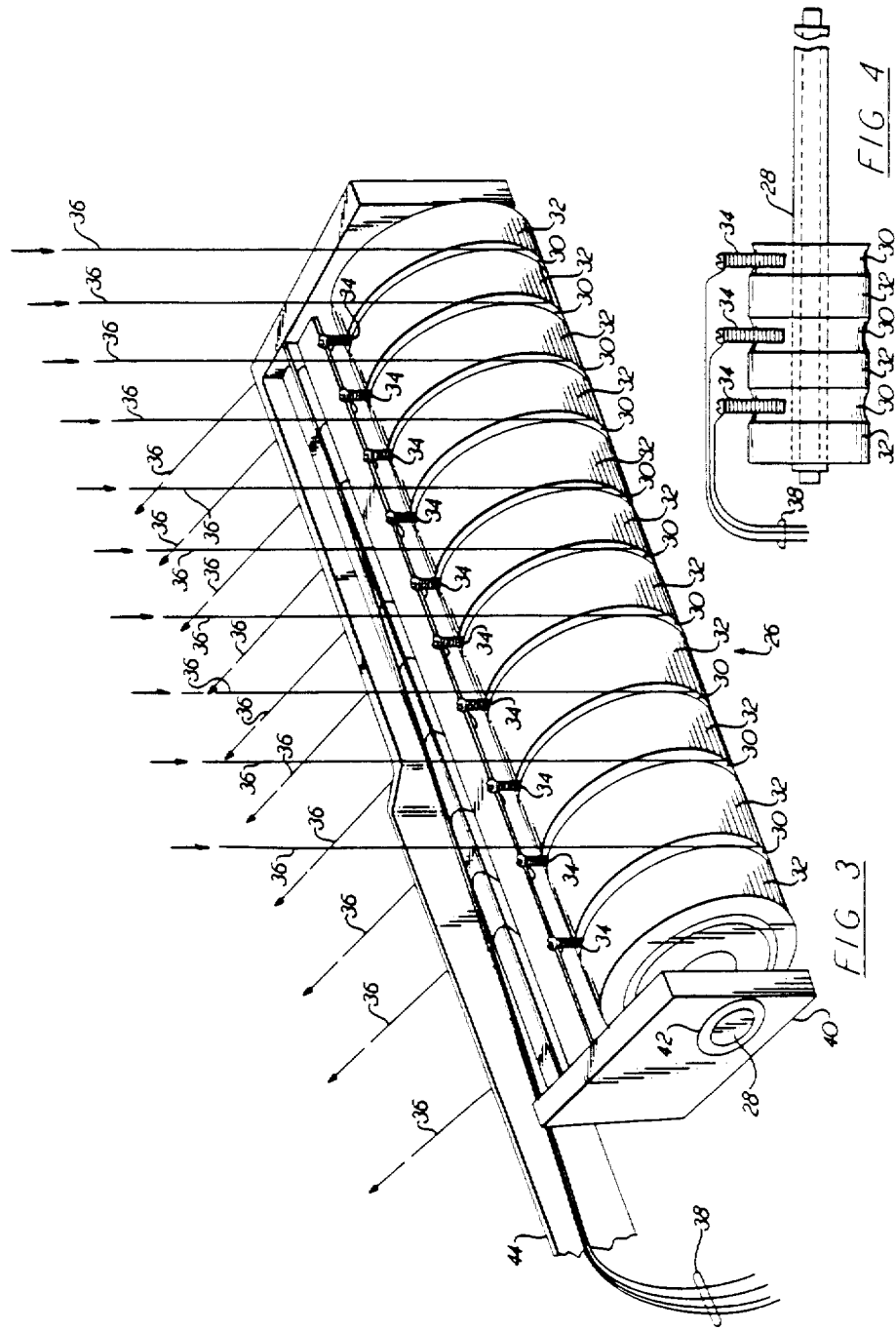

TEST

VOLT _____ CAL _____
OVEN _____ SIDE _____
DATE _____ TIME _____

| 1 | 2 | 3 | 4 | 5 | 6 | 7 | 8 | 9 | 10 |
|---|---|---|---|---|---|---|---|---|----|
| 0 | 0 | 0 | 0 | 0 | 0 | 0 | 0 | 0 | 5  |

| 0 | 0 | 0 | 0 | 0 | 0 | 0 | 0 | 5 | 0 |
|---|---|---|---|---|---|---|---|---|---|

FIG. 7

TEST

VOLT _____ CAL _____
OVEN _____ SIDE _____
DATE 1/1        TIME 0:01:18

| 1 | 2 | 3 | 4 | 5 | 6 | 7 | 8 | 9 | 10 |
|---|---|---|---|---|---|---|---|---|----|
| 5 | 0 | 0 | 4 | 1 | 0 | 5 | 1 | 6 | 10 |
| 1 | 1 | 0 | 2 | 3 | 3 | 2 | 1 | 1 | 0  |
| 1 | 1 | 0 | 0 | 0 | 0 | 1 | 1 | 2 | 2  |

FIG. 8